United States Patent [19]

Castellucci et al.

[11] Patent Number: 5,508,645

[45] Date of Patent: Apr. 16, 1996

[54] CIRCUIT FOR RAISING A MINIMUM THRESHOLD OF A SIGNAL DETECTOR

[75] Inventors: Gregg R. Castellucci, Plattsburgh; Terry C. Coughlin, Jr., Endwell, both of N.Y.

[73] Assignee: International Business Machines Corporation, Armonk, N.Y.

[21] Appl. No.: 412,241

[22] Filed: Mar. 28, 1995

[51] Int. Cl.[6] .................................................. H03K 5/22
[52] U.S. Cl. ............................ 327/77; 327/78; 327/80; 327/58
[58] Field of Search ............................ 327/58, 60, 63, 327/65–68, 514, 72–77, 205; 250/214 A; 375/317

[56] References Cited

U.S. PATENT DOCUMENTS

| | | | |
|---|---|---|---|
| 4,241,455 | 12/1980 | Eibner | 327/58 |
| 4,479,266 | 10/1984 | Eumurian et al. | 455/608 |
| 4,775,807 | 10/1988 | Bukowski, Jr. | 327/65 |
| 4,833,346 | 5/1989 | Marple | 307/359 |
| 4,833,418 | 5/1989 | Quintas et al. | 330/9 |
| 4,994,692 | 2/1991 | Wolke | 327/58 |
| 5,247,211 | 9/1993 | Sakura | 327/58 |
| 5,264,740 | 11/1993 | Wright | 327/63 |
| 5,329,173 | 7/1994 | Murakami et al. | 327/65 |
| 5,391,950 | 2/1995 | Krawczak | 327/65 |

Primary Examiner—Timothy P. Callahan
Assistant Examiner—Kenneth B. Wells
Attorney, Agent, or Firm—Eugene I. Shkurko

[57] ABSTRACT

A signal detector circuit in a data receiver including a programmable hysteresis circuit for setting and detecting the presence of both a threshold minimum data signal level and a reset signal level higher than the minimum signal level.

13 Claims, 5 Drawing Sheets

FIBER OPTIC RECEIVER SYSTEM DIAGRAM

CIRCUIT FOR RAISING A MINIMUM THRESHOLD OF A SIGNAL DETECTOR

FIELD OF THE INVENTION

This invention relates to a signal level detection function for a receiver. In particular, this circuit solves the problems associated with setting a specific turn-off threshold at a minimum signal level and then resetting a turn-on threshold, after the minimum signal level is reached, at a reset signal level higher than the minimum signal level. The set points and the amount of hysteresis, i.e., difference between the turn-off and turn-on thresholds (minimum and reset signal levels), are programmable for use in different applications and systems.

BACKGROUND OF THE INVENTION

A fiber optic transmission system consists of a fiber optic transmitter that converts electrical data to light pulses that are transmitted down the fiber optic cable to a fiber optic receiver that converts the light pulse back to electrical data. Some fiber optic receivers have signal detector circuits that check for the presence of a minimum signal (or light) from the fiber optic transmitter. Some of these detectors rely on an average signal level of an incoming signal. Signal detectors are used in data processing systems to determine if there is or is not a signal transmitted to a receiver of the data processing system.

In more sophisticated data transmission systems, a signal detect circuit can be used to determine the quality of the signal being received. In these systems, the signal detect circuit will trip at a specified signal level that is proportional to the light level at the fiber optic receiver. This implementation tells the data processing system not only is there a signal being detected by the receiver, but also that the signal is of a specified adequate strength for processing.

For transmission systems that don't require a low bit error rate (BER), a simpler signal detect circuit would be adequate. An example of this would be digital voice transmission. Loss of a small amount of data would not affect the voice (information) at the receiver end. It might produce short gaps in a continuous speech pattern or static in some other implementations.

For systems that do require an extremely low BER, it is necessary not only to communicate to the system that the signal at the receiver is present, but also that it has the minimum signal-to-noise ratio required by the receiver to correctly interpret the data and for the data processing system to properly process the data signals and guarantee a predetermined low BER.

The detector should also be glitch free at the trip point. When the signal at the receiver momentarily falls below the trip point, that is, the minimum signal level, the detector should switch low (indicate a weak signal) during this duration and not switch back high or oscillate before the signal level rises to a proper reset level. There should also be control over the reset point to which the signal level must increase in order for the signal detect circuit to switch back high (indicate strong signal). To maximize receiver sensitivity, the signal detect circuit must be passive with respect to the front end of the receiver circuit, i.e., cause minimal interference with the incoming signal, such that it does not reduce the receiver's signal-to-noise ratio. An example where this type of signal detect circuit would be used is in high-speed and high-volume digital data transmission.

SUMMARY OF THE INVENTION

The invention described herein solves the problems and provides the desirable features described in the previous section. This invention furnishes a programmable hysteresis function for use in a data signal detection circuit of a receiver. The signal detector circuit includes the following features.

The circuitry is controllable in two ways. First, the trip point can be controlled to correspond to a minimum data signal level required by the receiver or data processing system. Second, the point to which the data signal level must return, i.e., the reset point, in order to recover from the initial trip point is controllable depending on the required implementation. A comparator with a hysteresis feature is used to prevent chattering or oscillations in the detector when the data signal level hovers near the trip point.

An integration technique is used to remove the noise such that a signal can be detected below what the receiver can detect using a bit by bit comparison.

One embodiment of the present invention comprises a detector circuit for receiving data signals. The received signals are amplified and input to an indicator circuit to determine if the data signals are of a preselected and sufficient strength. An output of the detector indicates whether the data signals are higher than the preselected signal strength. If the data signal strength falls below the preselected level, the detector will output a low signal and the incoming data signals must then rise to a reset level higher than the original preselected level before the detector will output a high signal.

Other features and advantages of this invention will become apparent from the following detailed description of the presently preferred embodiment of the invention, taken in conjunction with the accompanying drawings.

BEST MODE FOR CARRYING OUT THE INVENTION

For maximum performance, the signal detector is implemented along a multistage receiver at a point where the data signals have not yet been digitized and is not at the input to the receiver where the signal may be weak and where the receiver is most sensitive. By avoiding the circuity at the input to the receiver the receiver's signal-to-noise ratio (SNR) will not be degraded by a reduction in the signal or increased noise at the receiver input.

Signal Detector with Minimum Threshold

Figure 1:
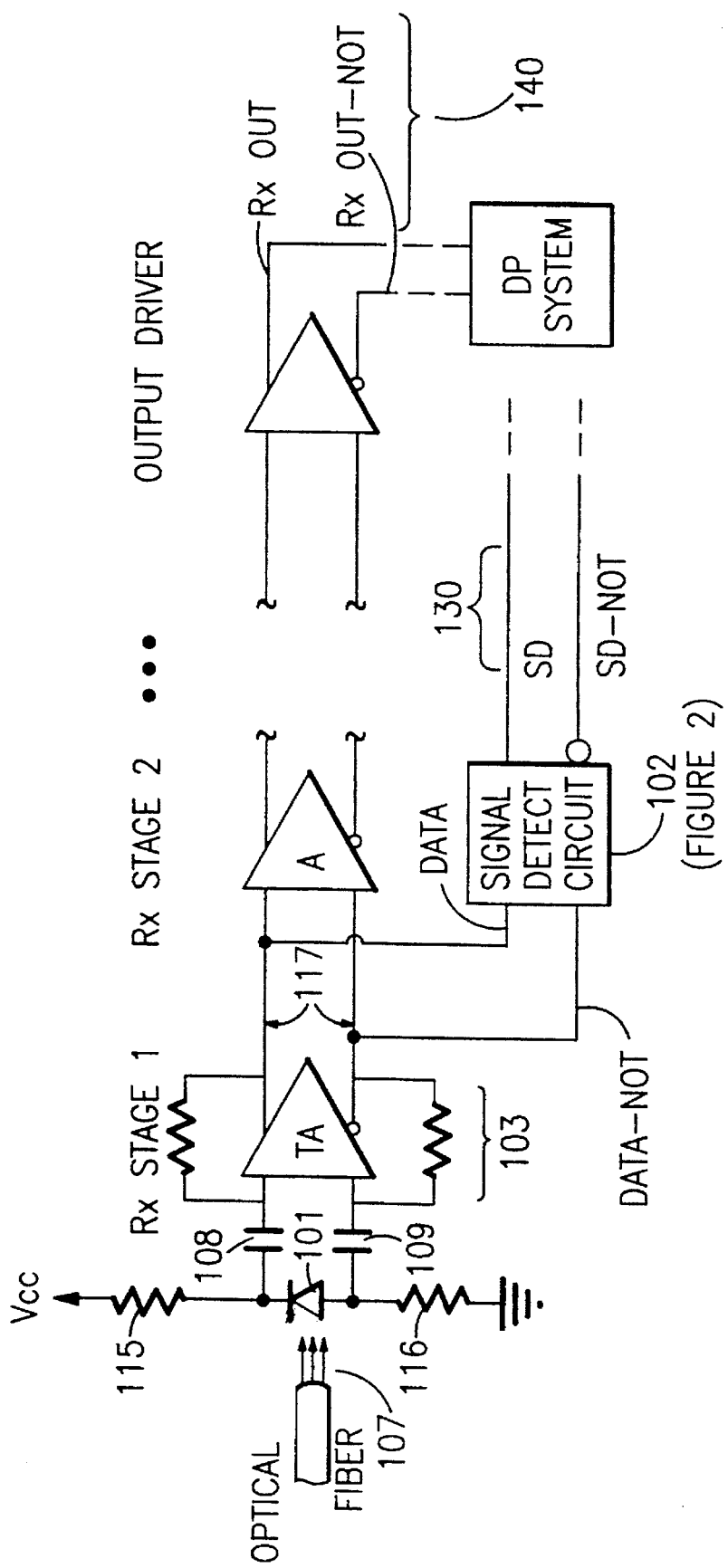
FIG. 1 is a fiber optic receiving system diagram.

The System Diagram of FIG. 1 shows where the Signal Detector Circuit 102 is coupled in an example fiber optic receiver system. Optical data 107 detected at the PIN diode 101 input to the fiber optic receiver is converted to a current. Resistor 115 coupled to voltage source $V_{cc}$ and resistor 116 coupled to ground provide a bias to the PIN diode. Capacitors 108 and 109 coupled to both ends of the PIN diode 101 provide AC coupling to the receiver first stage 103. The first stage 103 is a transimpedance amplifier (TA) in a typical configuration that converts the PIN diode current to a voltage 117. This first stage has enough gain to provide the signal-to-noise ratio (SNR) of the receiver, but not so high to cause weak (low SNR) data signals to be digitized. As can be seen in FIG. 1, the Signal Detect Circuit 102 inputs (data and data-not) are connected to the output of the fiber optic receiver's first stage 103. The outputs 130 of the Signal Detect Circuit and the receiver outputs 140 are connected to a data processing system with a CPU, or other device. The data processing system or receiving device determines how to handle data signals indicated by the detector 102, at its output 130, to be below a predetermined minimum threshold. Digital data from the output 117 of the fiber optic receiver's first stage is detected by and passed through the inputs of the Signal Detect Circuit (data and data-not).

Figure 2:
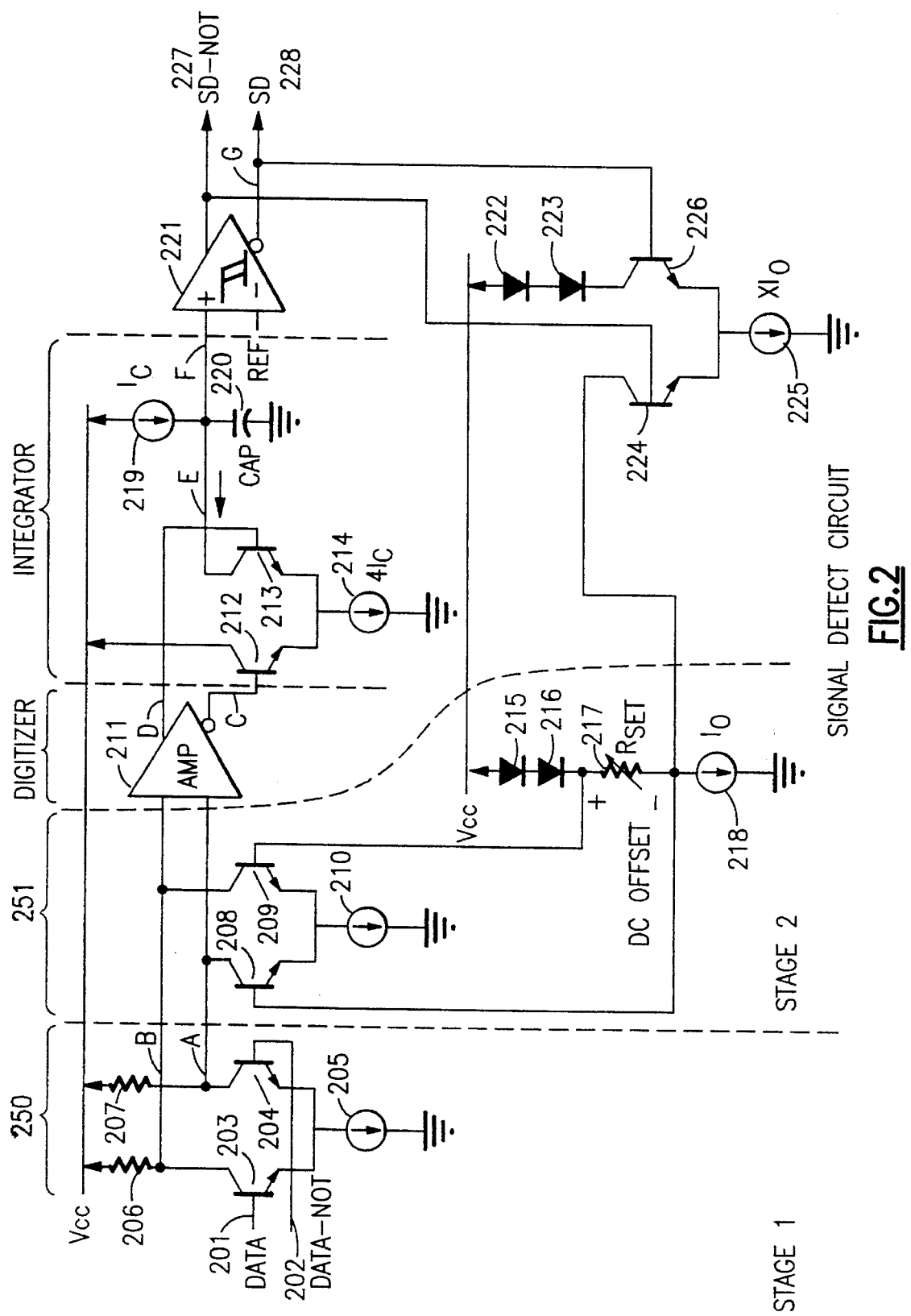
FIG. 2 is a schematic diagram of the signal detector.
Figure 3:
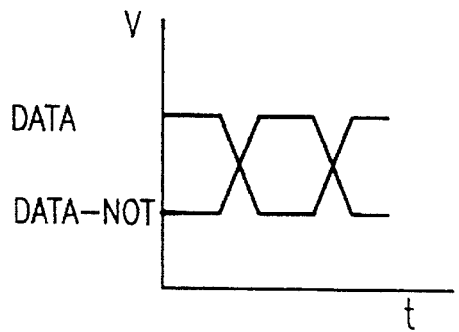
FIG. 3 shows weak signal waveforms at the detector inputs.

FIG. 2 illustrates in more detail the Signal Detect Circuit 102. The first stage differential amplifier 250 comprises two bipolar transistors 203 and 204 coupled to a DC current source 205, as shown, and to $V_{cc}$ via resistors 206 and 207, respectively. At low light levels, the optical signal 107 is converted by the TA 103 and PIN diode 101 to an electrical signal (voltage) in the linear range of the first stage differential amplifier 250, which minimizes interference with the data signals sent to the receiver second stage. This differential amplifier output signal is separated by a DC offset introduced at the bases of the second stage differential amplifier 251 of the Signal Detect Circuit. The second stage amplifier also comprises two bipolar transistors 208 and 209 coupled to a current source 210. The bases of the transistors are connected to the second stage offset control circuit which comprises series diodes 215 and 216 connected to $V_{cc}$ at their anodes and at their cathodes to a potentiometer 217 and to the base of transistor 209. The potentiometer 217 is also connected to an adjustable current source 218 and to the base of transistor 208. The result of this second stage DC offset effect upon incoming signals 201 and 202 is provided at points A and B, illustrated in FIGS. 3 and 4, which in turn provides inputs to the differential amplifier 211. The operation of the remaining Signal Detect Circuit components will be explained via the following examples.

EXAMPLE 1

Signal levels 107 below the minimum predetermined (or detectable) level

Figure 4:
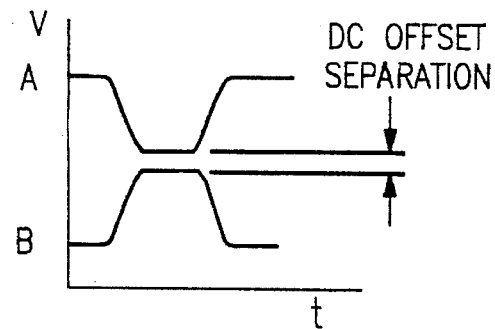
FIG. 4 shows the weak signal waveforms of FIG. 3 offset by the DC offset circuit.

If the light level 107 is below the minimum detectable level (preselected), the resulting offset output at A and B is as shown in the waveforms of FIG. 4 where the signals at A and B do not cross, i.e., the DC offset is sufficient to cause the separation of the signals as shown in FIG. 4.

Figure 5:
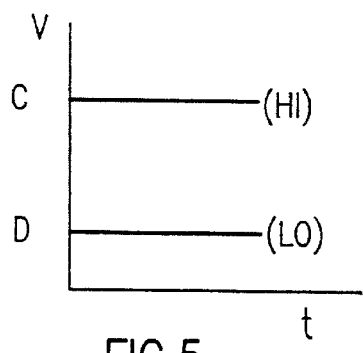
FIG. 5 shows the output of the third stage differential amplifier in response to weak data signals.
Figure 6:
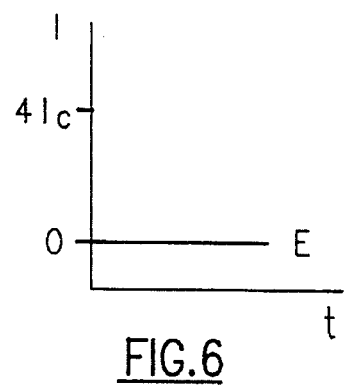
FIG. 6 shows capacitor discharging current when the data signals are weak.
Figure 7:
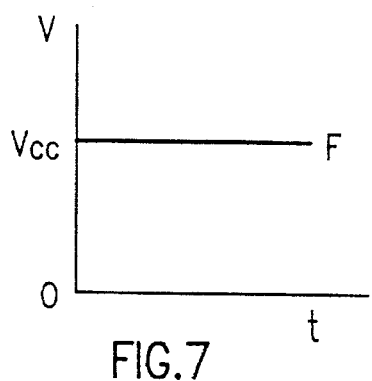
FIG. 7 shows the comparator input voltage when the data signals are weak.
Figure 8:
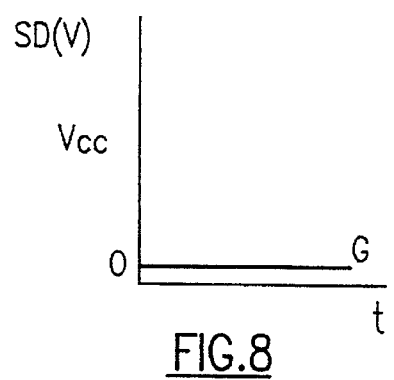
FIG. 8 shows the detector output indicating data signals below the minimum threshold (weak).

The signals A and B are then digitized by the differential amplifier 211. Because the signals at the inputs (A and B) do not cross, the output at D will remain low (because the voltage at A always remains more positive than the voltage at B), illustrated in FIG. 5, which shuts off transistor 213 causing a low discharge current E (FIG. 6) and capacitor 220 remains charged by current source 219. Because the capacitor 220 is constantly being charged by the current source 219 the voltage across the capacitor 220 will be close to $V_{cc}$ in this situation. Thus, this high voltage level (at point F), shown in FIG. 7, is input to comparator 221 and compared to the reference voltage (Ref voltage between a logical 1 and 0) and the output of the comparator 228, i.e., the Signal Detect Circuit output (SD) at point G is low (FIG. 8), indicating the signal is too small for the system's required Bit Error Rate (BER). As shown in FIG. 1, this output 228 (SD) is sent to the data processing system or other device.

EXAMPLE 2

Signal levels 107 above the minimum predetermined (or detectable) level

Figure 9:
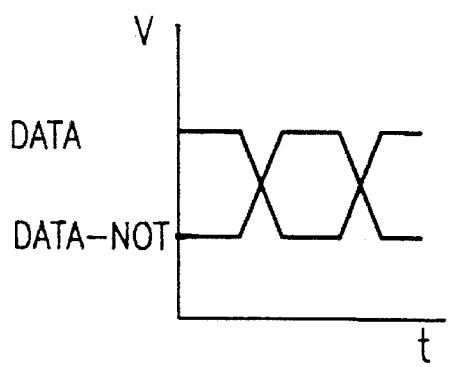
FIG. 9 shows strong signal waveforms at the detector inputs.
Figure 10:
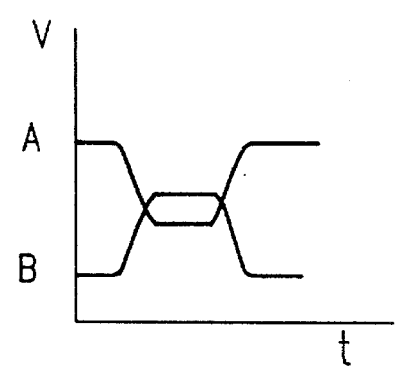
FIG. 10 shows the strong signal waveforms of FIG. 9 offset by the DC offset circuit.
Figure 11:
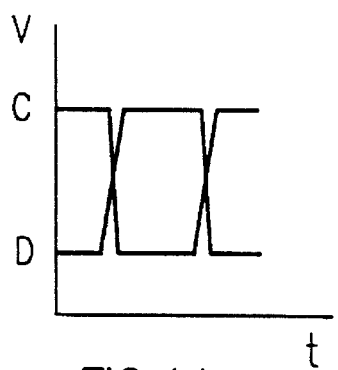
FIG. 11 shows the output of the third stage differential amplifier in response to strong data signals.
Figure 12:
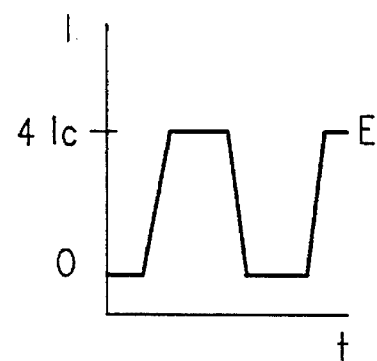
FIG. 12 shows capacitor discharging current when the data signals are strong.
Figure 13:
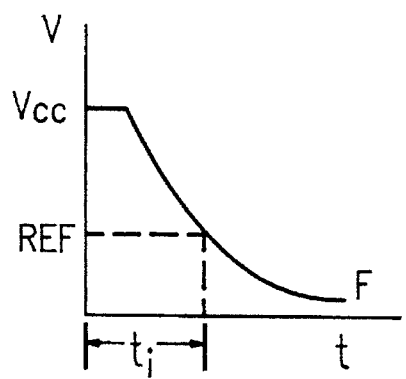
FIG. 13 shows the comparator input voltage and integration time when the data signals start weak but rise above the reset signal level.
Figure 14:
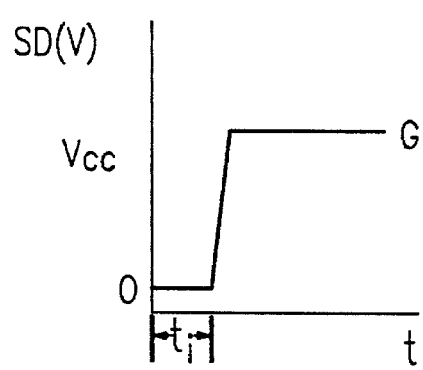
FIG. 14 shows the detector output indicating that the data signal strength has risen above the reset signal level.

Stronger data signals 201 and 202, shown in FIG. 9, result in the output signals crossing, or switching, at A and B, shown in FIG. 10, since the DC offset is insufficient to separate the stronger data signals at A and B, thereby causing the outputs C and D of the digitizer 211 to switch, as shown in FIG. 11. The switching signal at D causes a pulsing current E, shown in FIG. 12 as equal to $4I_c$, to discharge the capacitor 220 at twice the rate it is being charged by the current $I_c$ from source 219. This discharge rate occurs due to current source 214 drawing $4I_c$ and assuming the data signals comprise balanced code, i.e., an approximately equal number of 1's and 0's over time, which would switch transistor 213 on for a time approximately equal to the time that it is switched off. If the incoming data signals are unbalanced, either of the current sources 214 or 219 can be chosen or set accordingly. Thus, the comparator input signal at F decreases, as shown in FIG. 13, until it falls below the reference voltage (Ref) at time $t_1$ (integration time) causing the comparator output 228 (SD) to go high, as shown in FIG. 14, which is the Signal Detect Circuit output indicating that the data signal strength is adequate.

Signal Detector Automatically Adjusting a Reset Level

Referring to FIG. 2, the Signal Detect Circuit uses the outputs 227 and 228 (SD-NOT and SD, respectively) as feedback to change the DC offset at the bases of the second stage differential amplifier 251. The disclosed circuit uses feedback to implement a Signal Detect threshold at two different levels for the two separate states described above and will be explained by way of the following examples.

EXAMPLE 3

For decreasing optical signals.

This is when the data signal strength at the input 107 is large enough to keep the SD output 228 high and then the data signal strength starts to decrease below the minimum threshold. Since this minimum threshold is proportional to $I_o \times R$ 217, it is controllable by adjusting the DC offset via the adjustable current source 218 ($I_o$) or by adjusting the potentiometer 217.

Figure 15:
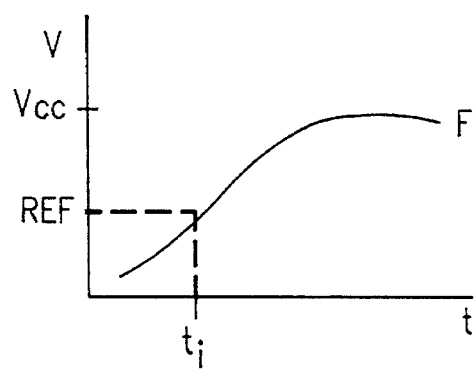
FIG. 15 shows the comparator input voltage and integration time when the data signals start strong and fall below minimum threshold signal level.
Figure 16:
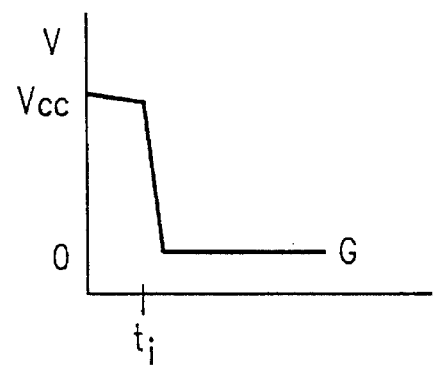
FIG. 16 shows the detector output indicating that the data signal strength has fallen below the minimum threshold signal level.

After the integration time ($t_1$ of FIGS. 15 and 16) elapses and the voltage at F rises above the reference voltage the output 228 (SD) switches to a low state, described above in the discussion of Example 1 and in converse performance to the above discussion of Example 2. This low output state 228 causes an additional current ($XI_o$) to flow through potentiometer 217 as follows. When the comparator 221 output 228 goes low, the complementary output 227 goes high. This results in the transistor 226, whose base is connected to output 228, shutting off and blocking current flow from $V_{cc}$ through coupled series diodes 222 and 223, normally drawn by adjustable current source 225 if the transistor 226 was open, i.e, output 228 high as explained below in Example 4. Correspondingly, transistor 224, whose base is connected to comparator output 227 (high), is open, and current $XI_o$ is drawn through this transistor 224 by the adjustable current source 225. The source of this transistor 224 is coupled to the potentiometer 217 as shown in FIG. 2, thus drawing more current through the potentiometer and increasing the DC offset. Thus, this increase in the DC offset, i.e., the difference between the minimum data signal level and the reset signal level, is controllable by adjusting current $XI_o$ through the adjustable current source 225.

The voltage drop across R 217 is now $[(1+X)I_o \times R]$. This separates the signals (increases the offset) at A and B by an additional amount proportional to X (light level hysteresis). Thus, the light 107 (data signals) must increase by an amount proportional to X (up to the reset level) to cause the signals A and B to cross as shown in FIG. 10 and result in the Signal Detect Circuit output 228 to switch back high and indicate to the attached system that the incoming data signals are of adequate strength, as explained above in the discussion under example 2.

EXAMPLE 4

For increasing optical signals.

This is when the data signal strength at the input 107 is small enough to keep the SD output 228 low and then the data signal strength starts to increase and reaches the reset signal level (threshold that is proportional to $[(1+X)I_o \times R]$. This causes the signals A and B to cross as shown in FIG. 10 and the circuit behaves as explained above in Example 2. After the integration time ($t_1$) elapses, the voltage at F falls below the reference voltage (Ref) and output 228 (SD) switches to a high state, as shown in FIGS. 13 and 14, while output 227 switches low. The high output 228 causes transistor 226 to open and current ($XI_o$) will flow through open transistor 226. Transistor 224 is turned off by low output 227 connected to its base and the additional current $XI_o$ is not drawn through potentiometer 217. The voltage drop falls across R 217 (now proportional to $I_o \times R$). This reduces the DC offset to the original level preset by adjustable current source 218 and R 217 (proportional to $I_o \times R$). The data signal strength must now decrease to the original minimum threshold before the Signal Detect Circuit output 228 will switch back low.

The integration time $t_1$, referred to above, provides tolerance in the case of a single weak (below minimum threshold) data bit received at the Signal Detect Circuit. Since $t_1$ will be longer than the wavelength of any received bit (due to the charge rate of the capacitor 220) the capacitor 220 will not have enough time to charge above the reference voltage (Ref) and the comparator outputs 227 and 228 will not switch due to the short duration of the individual weak data bit.

Alternative Embodiments

It will be appreciated that, although specific embodiments of the invention have been described herein for purposes of illustration, various modifications may be made without departing from the spirit and scope of the invention. For example, various data processing systems are well known articles of commerce and are not described further.

In particular, FET transistors may be implemented instead of bipolar, the amplifiers, current sources, and resistors may be of different design such as fixed or variable current sources and resistances, for example. The detector may be implemented separately and then assembled into a preexisting receiver system, the inputs may be coupled to different stages of the receiver circuit, and the detector may be implemented in a non-optical receiver system. Accordingly, the scope of protection of this invention is limited only by the following claims and their equivalents.

We claim:

1. A signal detector circuit comprising:

receiving means for receiving data signals;

a level indicator circuit coupled to the receiving means for determining whether or not a signal strength of the data signals is less than a preselected minimum signal level;

output means coupled to the level indicator circuit for indicating whether or not the signal strength of the data signals is less than the preselected minimum signal level; and reset means coupled to the output means for setting a reset minimum signal level greater than the preselected minimum signal level by a preselected difference in response to an indication by the output means that the signal strength of the data signals is less than the preselected minimum signal level, the output means maintaining the indication that the signal strength of the data signals is less than the preselected minimum signal level until the signal strength of the data signals reaches the reset minimum signal level.

2. The circuit according to claim 1, wherein the receiving means includes a differential amplifier having a pair of transistors coupled to a transmission path of the data signals and to a current source.

3. The circuit according to claim 1, wherein the level indicator circuit comprises:

offset means coupled to data signal lines carrying the data signals for separating a voltage level of the data signal lines by a preselected separation amount, the offset means including a resistance for generating the preselected separation amount; and digitizer means coupled to said data signal lines for outputting a pair of crossing signals in response to crossing voltages of said data signal lines, and for outputting a pair of constant voltage signals in response to voltages of said data signal lines not crossing.

4. The circuit according to claim 3, wherein the level indicator circuit further comprises:

integrator means coupled to the digitizer means for receiving said pair of crossing signals and said constant voltage signals, the integrator means including capacitor means and transistor means, the transistor means discharging the capacitor means in response to the integrator means receiving said pair of crossing signals and charging the capacitor means in response to the integrator means receiving said constant voltage signals.

5. The circuit according to claim 4, wherein the output means includes means for indicating whether or not the signal strength of the data signals is less than the preselected minimum signal level in response to the charging or discharging of the capacitor means.

6. The circuit according to claim 3, wherein the reset means includes transistor means coupled to a current source and to the offset means, the transistor means drawing through the offset means an amount of additional current preselected by the current source for increasing the preselected separation amount in response to the output means indicating that the signal strength of the data signals is less than the preselected minimum signal strength.

7. A data processing (DP) system comprising:

receiving means for receiving data signals, the receiving means including an output means outputting the data signals to the DP system;

a signal detector coupled to the receiving means for determining whether or not a signal strength of the data signals is greater than a preselected minimum signal level, and for indicating to the DP system whether or not the signal strength of the data signals is greater than the preselected minimum signal level;

processing means for processing the data signals and the indication to the DP system from the signal detector; and the signal detector including a reset circuit for setting a reset minimum signal level greater than the minimum signal level by a preselected difference in response to the signal detector indicating to the DP system that the signal strength of the data signals is less than the preselected minimum signal level, the signal detector maintaining an indication to the DP system that the signal strength of the data signals is less than the preselected minimum signal level until the signal strength of the data signals reaches the reset minimum signal level.

8. The data processing system according to claim 7, wherein the reset circuit includes:

a sensing circuit coupled to an output of the signal detector for receiving the indication to the DP system whether or not the signal strength of the data signals is greater than the preselected minimum signal level;

an offset circuit including a resistance connected to a first current source for setting the preselected minimum signal level; and a current circuit including a second current source connected to the sensing circuit, the sensing circuit including a transistor coupled to the resistance such that the second current source draws a preselected amount of additional current through the transistor and through the resistance in response to the sensing circuit receiving the indication to the DP system that the signal strength of the data signals is less than the preselected minimum signal level, the preselected amount of additional current through the resistance setting the reset minimum signal level.

9. A feedback circuit for a signal detector, the feedback circuit comprising:

a sensing circuit coupled to an output of the signal detector for receiving an insufficient signal issued by the signal detector indicating that signals incoming to the signal detector are below a minimum threshold, and for receiving a 'sufficient' signal issued by the signal detector indicating that the incoming signals are above or equal to the minimum threshold; and a reset circuit coupled to the sensing circuit for raising the minimum threshold in response to the sensing circuit receiving the insufficient signal from the signal detector so that the signal detector continues issuing the insufficient signal until the incoming signals are above or equal to the raised minimum threshold.

10. The feedback circuit according to claim 9, wherein the reset circuit includes:

an offset circuit coupled to the signal detector for generating an offset voltage and for applying to the incoming signals a voltage proportional to the offset voltage;

a current circuit for increasing the offset voltage by a preselected amount in response to the sensing circuit receiving the insufficient signal from the signal detector; and the offset circuit applying to the incoming signals a voltage proportional to the increased offset voltage such that the signal detector issues the insufficient signal until the incoming signals are above the minimum threshold by an amount proportional to the increase in the offset voltage.

11. The feedback circuit according to claim 10, wherein the offset circuit includes a resistance connected to a first current source, a voltage across the resistance equal to the offset voltage.

12. The feedback circuit according to claim 11, wherein the offset circuit further includes a differential amplifier, and wherein both ends of the resistance are connected to the differential amplifier, the differential amplifier connected to the signal detector for applying to the incoming signals a voltage proportional to the offset voltage.

13. The feedback circuit according to claim 11, wherein the current circuit includes a second current source connected to the sensing circuit, and wherein the sensing circuit includes a transistor coupled to the resistance such that the second current source draws a preselected amount of additional current through the transistor and through the resistance in response to the sensing circuit receiving the insufficient signal from the signal detector, the preselected amount of additional current through the resistance generating the increased offset voltage.

\* \* \* \* \*